United States Patent [19]

Johnson

[11] Patent Number: 4,492,916
[45] Date of Patent: Jan. 8, 1985

[54] DIGITAL METER USING CALCULATOR COMPONENTS

[76] Inventor: Benjamin A. Johnson, 77 Ridgeway Ave., Rochester, N.Y. 14615

[21] Appl. No.: 304,241

[22] Filed: Sep. 21, 1981

Related U.S. Application Data

[63] Continuation of Ser. No. 59,371, Jul. 20, 1979, abandoned.

[51] Int. Cl.³ .................. G06F 3/05; G01R 11/52; G01R 27/26
[52] U.S. Cl. .................. 324/60 CD; 324/62; 324/157; 364/705
[58] Field of Search ............ 364/705; 324/157, 57 R, 324/60 R, 60 CD, 61 R, 62, 65 R

[56] References Cited

U.S. PATENT DOCUMENTS 4,370,727  1/1983  Bellet .................. 364/705

*Primary Examiner*—Ernest F. Karlsen
*Assistant Examiner*—Jose M. Solis
*Attorney, Agent, or Firm*—Stonebraker, Shepard & Stephens

[57] ABSTRACT

The invention uses an RC circuit 12 to convert an analog quantity to be measured into a time interval proportional to the measured quantity by using a resistive element in the RC circuit responsive to the quantity being measured. The RC circuit starts and stops a time base generator 13 to produce pulses having a total number proportional to the time interval, and a gate system 14 applies the pulses to the key terminals of the circuitry 16 of a pocket calculator 10 for indicating the pulse count on a display 15, either directly or after being processed by functions available in the calculator circuitry. The RC circuit can also be used to start and stop a time base generator 33 built into a digital stopwatch for displaying a pulse count proportional to the quantity measured. The measured quantity can be a capacitance value, a resistance value, or energy impinging on a responsive transducer in the RC circuit.

16 Claims, 8 Drawing Figures

DIGITAL METER USING CALCULATOR COMPONENTS

RELATED APPLICATIONS

This application is a continuation of my parent application Ser. No. 059,371, filed July 20, 1979, entitled Digital Meter Using Calculator Components, and abandoned upon the filing of this application.

BACKGROUND OF THE INVENTION

This invention involves measuring an analog quantity and using electronic pocket calculator components to display a digital value as a function of the quantity measured. It not only recognizes that pocket calculator components provide an economical and versatile digital display capacity, but it also recognizes a simply way of converting an analog quantity to a form that can be processed and displayed by calculator components. It suggests ways that many analog quantities can be measured for many useful purposes and aims at low cost, high accuracy, and versatility.

The invention can also be practiced with digital stopwatch components, and it can add metering capacity to a calculator or digital stopwatch without impairing normal usage. The additional components required for practicing the invention can often fit within the original calculator or stopwatch case, and the invention takes advantage of calculator function capacity for processing the displayed value for improved usefulness, convenience, and versatility.

SUMMARY OF THE INVENTION

The inventive method measures an analog quantity and uses calculator or digital stopwatch components including a digital display, a time base generator, and circuitry for operating the display to show a numerical value relating to the quantity measured. The time base generator is among the existing components of a digital stopwatch but is added to a calculator. The metering function is accomplished by an RC circuit that converts the analog quantity into a time interval during which the time base generator delivers to the display circuitry a number of pulses proportional to the time interval and the quantity measured. The RC circuit starts and stops the time base generator at the beginning and end of the time interval required for the capacitor to change from an initial state to a terminal state. The total pulses delivered and the number displayed are then functions of the analog quantity measured.

For an energy value such as light, temperature, pressure, etc., the RC circuit includes an integrating capacitor of known capacity and a transducer having a resistance that varies in response to energy impinging on the transducer so that changing the capacitor charge from the initial state to the terminal state requires a time interval that varies proportionally to the resistance of the transducer and to the energy impinging on the transducer. For measuring a capacitance value, the RC circuit uses a capacitor to be measured and a stable resistor having a known resistance so that the time interval for changing the capacitor charge varies proportionally to the measured capacitance. For measuring a resistance value, the RC circuit uses an integrating capacitor having a known capacitance and a resistor to be measured so that the charge changing time interval varies proportionally to the measured resistance.

The metering function is accomplished by connecting a few components to the circuitry of a calculator or digital stopwatch to provide a switch, an RC circuit arranged to respond to the quantity to be measured, and a way of starting and stopping the pulse generation at appropriate times for a measurement. As applied to a calculator, the added components are preferably connected between the keyboard and the calculator circuitry and arranged for electronically actuating the appropriate key terminals so that the pulses delivered from the time base generator are added and displayed, with or without processing by one of the calculator functions.

DRAWINGS

DETAILED DESCRIPTION

Figure 1:
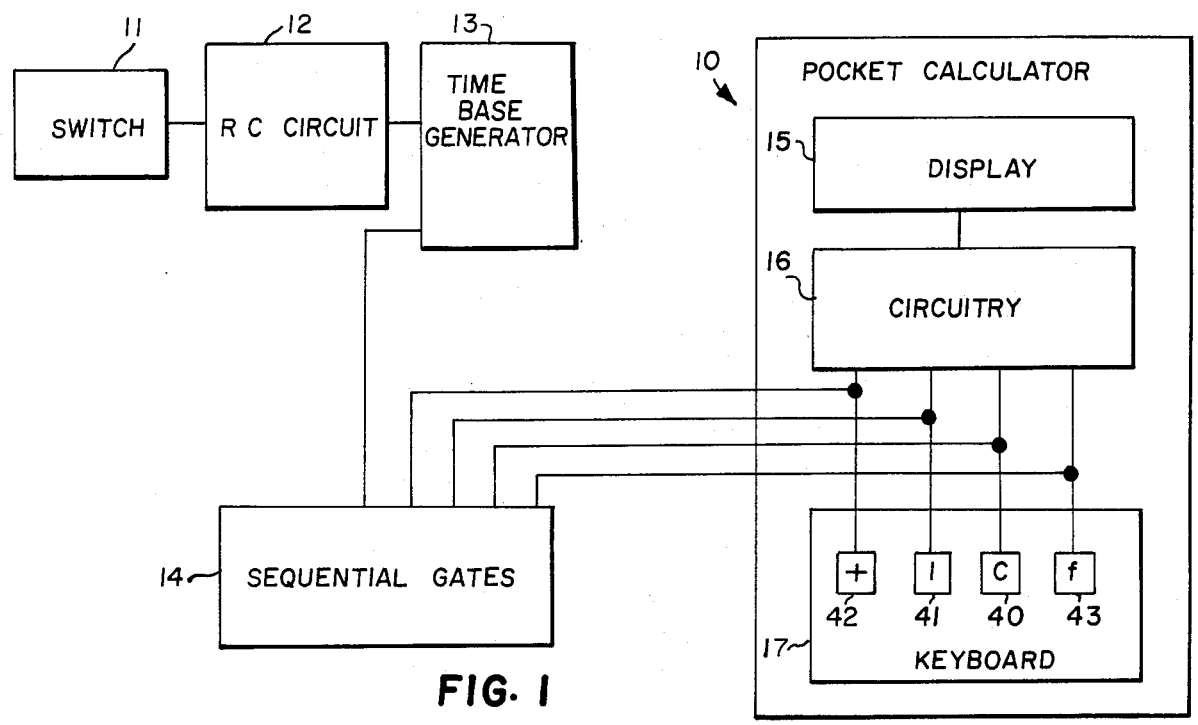
FIG. 1 is a schematic diagram of a preferred embodiment of the invention as applied to a pocket calculator.

The prior art of digital metrology ordinarily begins with an analog signal amplified with a linear, low noise, high gain amplifier requiring a precision power supply. The amplified signal can be processed according to a mathematical function such as an inversion, a logarithmic conversion, multiplication, division, etc.; but with or without this, the analog signal is converted to digital by an analog-to-digital converter arranged to operate a digital display. Accuracy requires expensive components for power supply precision and regulation and zero and span adjustments; and even though much of the necessary circuitry is available in ready-to-use packages, it is bulky and expensive; requires complex designing; and produces uncertainty in the displayed output because of drift, aging of components, etc. All this makes digital metrology relatively expensive.

By adding to the components available in pocket calculators and digital stopwatches, the invention makes digital metrology possible at a much lower cost in a reliable and simple way. The added components can usually be fitted within the original case for a calculator or stopwatch and used without impairing normal functioning. Components can also be extracted from calculators or stopwatches and used in building digital meters having no separate calculator or stopwatch functions.

FIGS. 1-4 schematically show a preferred way of applying the invention to a pocket calculator to meter any one of several possible analog quantities and display the measurement in a useful numeric form. The components added to pocket calculator 10 include an actuating switch 11, an RC circuit 12 that converts the metered quantity to a time interval, a time base generator 13 that produces evenly spaced pulses during the time interval, and a gate system 14 for applying the pulses from generator 13 to the calculator circuitry in various ways depending on the results desired and the sophistication available. The invention takes advantage of the digital display 15 and its driving circuitry 16 within calculator 10 and uses connections between keyboard 17 and circuitry 16 as schematically illustrated.

Pulses from generator 13 electronically actuate key terminals of circuitry 16 to simulate actuation of keys on keyboard 17 to drive circuitry 16 to display an appropriate numerical value in display 15. The RC circuitry 12 is arranged to start generator 13 when switch 11 is actuated with an integrating capacitor in a predetermined initial state and to stop generator 13 when the integrating capacitor reaches a terminal state. This produces a train of pulses directly proportional to the time interval required to change the charge state of the integrating capacitor so that the number of pulses represent the duration of the time interval. By adding or otherwise processing the pulses according to a function available in calculator 10, a relevant number is displayed as a function of the time interval so that operation of the device for a brief and variable interval accomplishes metering and digital display in a simple and reliable way.

Figure 2:
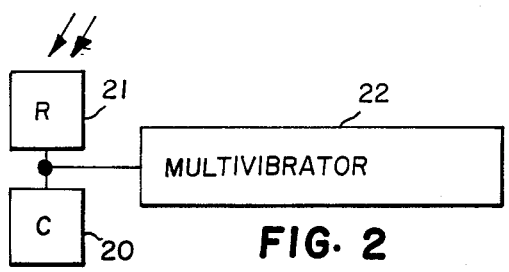
FIGS. 2-4 are schematic diagrams of preferred alternative ways of arranging an RC circuit for metering different values according to the invention.
Figure 3:
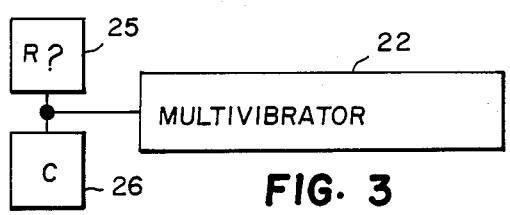
Figure 4:
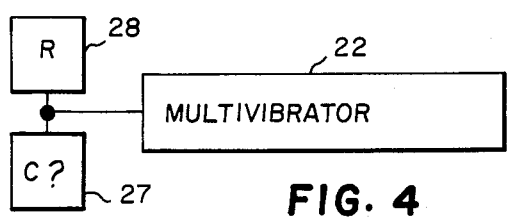

The arrangement of FIG. 1 can be used to measure several different values as shown in FIGS. 2-4. For measuring an energy value as shown in FIG. 2, the RC circuit uses an integrating capacitor 20 having a known capacitance value and a transducer 21 having a resistance that varies as a function of impinging energy. The RC circuit drives a multivibrator 22 serving as a time base generator.

Transducer 21 can respond to many forms of energy, including the intensity of light and other radiation, temperature, pressure, velocity, gravity, mass, elevation, electrical energy, and probably others. The invention takes advantage of existing technology for converting impinging energy into an analog electrical signal having a direct, inverse, or other proportion to the energy involved. The relationship between the impinging energy and the electrical signal of transducer 21 can vary extensively; because the calculator circuitry can be used to process the pulses to produce a numerical value in the most desired form, regardless of the initial relationship of the pulses to the quantity being measured. Photoresistive elements responsive to incident light are very useful in providing a resistance that varies as incident light changes, and such transducers can be used in the embodiment of FIG. 2 to accomplish photometry in a wide variety of applications.

The inventive metering method applies to measuring a resistance value as schematically shown in FIG. 3 where an unknown resistor 25 is coupled with an integrating capacitor 26 having a known capacitance value for driving multivibrator 22 serving as a time base generator. Such a circuit converts the resistance of resistor 25 into a time interval represented by a number of pulses that can be processed to produce a relevant numerical display.

In a similar way, the circuit of FIG. 4 can be used to measure the value of an unknown capacitor 27 coupled with a resistor 28 having a known resistance value for driving multivibrator 22. This circuit converts the capacitance value of capacitor 27 into a time interval defined by a number of pulses that are processed and displayed as a numerical capacitance value.

Metering and digital display of other analog quantities requires only transducers for converting the measured value to a variable resistance or a variable capacitance that can be arranged in RC circuit 12 to establish a time interval for the pulses from a time base generator 13.

Figure 5:
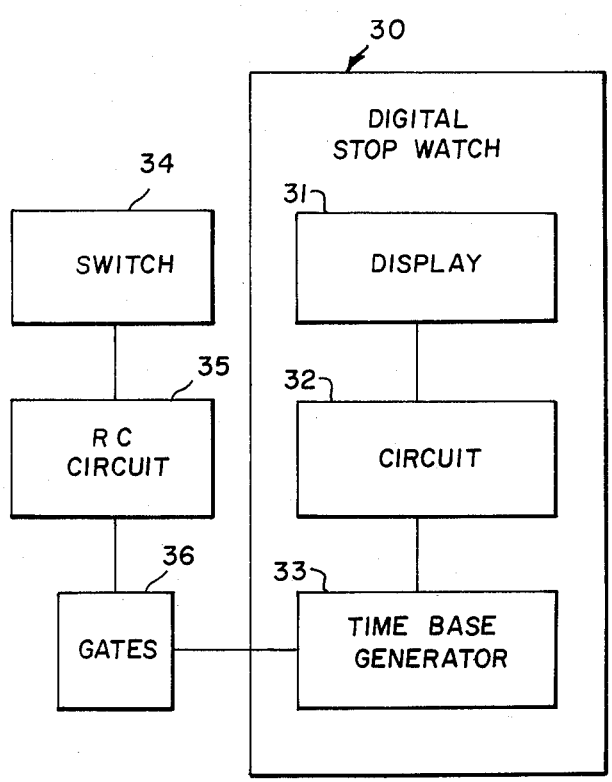
FIG. 5 is a schematic diagram of a preferred embodiment of the invention as applied to a digital stopwatch.

FIG. 5 schematically shows a preferred way of applying the invention to a digital stopwatch 30, which contains a display 31, display-driving circuitry 32, and a time base generator 33. Since digital stopwatch 30 contains a built-in pulse generator 33, this component does not have to be added as it does to pocket calculator 10. However, digital stopwatch 30 has no keyboard or mathematical function capacity so that it is not as versatile as calculator 10 in processing a pulse sequence. Generally, a stopwatch 30 can count at a faster rate and accomplish a desired measurement more quickly than calculator 10, although this varies widely with particular devices.

Because of built-in generator 33, the additional components for giving stopwatch 30 a metering capacity include only switch 34, RC circuit 35, and a gate system 36 for starting and stopping generator 33. RC circuit 35 can include any of the variations previously described relative to FIGS. 2-4 for measuring many different values.

The components added to a calculator or stopwatch in practicing the invention can have many forms. These include many different types of switches, relays, optoisolators, integrated circuit gates, multivibrators, etc. Solid state devices are currently available that impose no substantial electrical load on the calculator or stopwatch circuitry or adversely influence the charge integrating process in the RC circuit. Essentially resistive transducers are preferred in combination with low leakage capacitors for accuracy in the RC circuit, and the external components are preferably formed of CMOS gates that can be driven by the power supply of the calculator or stopwatch without imposing any more load than is represented by illumination of a digit of an LED display.

The integrating capacitor is dimensioned relative to the degree of resolution desired and the metering time interval desired for a reasonably rapid measurement producing preferably three significant digits in a displayed value. The frequency of the pulse generator is preferably adjustable so that the pulses arrive at the calculator circuitry at a rate that is within the totalizing limitations of the particular calculator used. The pulse generator can be made from a CMOS integrated circuit gate package to perform as a multivibrator with an output frequency that is adjustable via a potentiometer. The multivibrator can be started and stopped by gating circuitry that applies the capacitor charge to an appropriate gate in the vibrator circuit, and the same CMOS gate package can be connected to calculator circuitry for electronically actuating keyboard terminals.

In a simple form of the invention as schematically shown in FIG. 1, the operator clears the calculator display 15 by pressing clear key 40, presses key 41 to enter a number 1 on display 15, and actuates switch 11 to operate RC circuitry 12 and start generator 13. The pulses that continue for the duration of the interval required to change the charge on the integrating capacitor to its terminal state are electronically applied to the circuitry terminal for plus key 42 for repeatedly adding the pulses until the interval ends and the total number of pulses is readable on display 15. Sequential gates 14 can be used for delivering pulses to other key terminals such as a function key 43 for processing the total number of pulses according to a function such as an inversion, logarithmic conversion, a ratio compared with a memorized value, and other functions and combinations of functions. The operation is analogous to pressing a key for each pulse that occurs during the measuring time interval, and the existing connections between keyboard 17 and circuitry 16 are readily accessible for such operation.

The invention can also be arranged to repeat the measuring interval automatically and redisplay the final numerical value, simply by using sequential gates connected at appropriate keyboard terminals to circuitry 16. Variation in the possible displays and repetitions of displays is limited only by the capacity of calculator 10, which under current technology is considerable.

Figure 6:
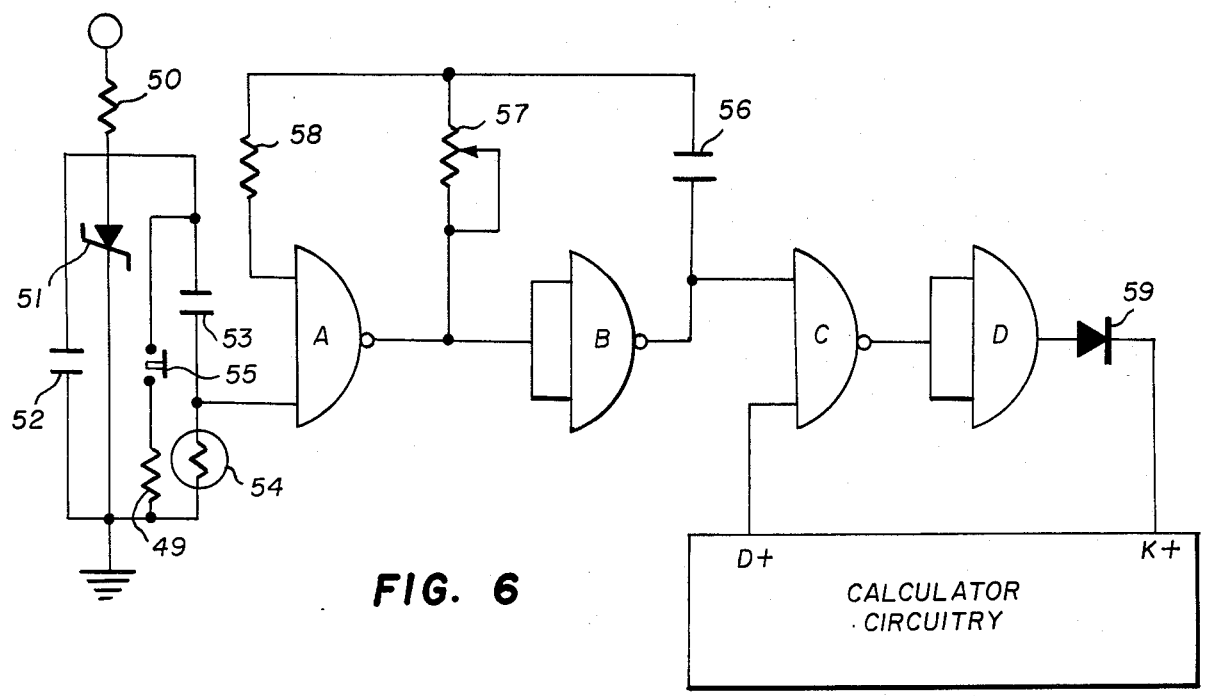
FIG. 6 is a schematic diagram of preferred components used in applying the invention to a pocket calculator.

FIG. 6 shows a preferred configuration of components for adding to a pocket calculator to form a digital photometer according to the invention. It operates from the existing calculator power source that is typically 9 volts dc, and it uses a current-limiting resistor 50 in series with a zener diode 51 for a power supply that is smoothed by filter capacitor 52. Its RC circuit is formed by integrating capacitor 53 and a photoresistive or light responsive, resistive transducer 54. A push button switch 55 in series with a current-limiting resistor 49 controls operation.

The device of FIG. 6 also uses gates A, B, C, and D that are typical CMOS NAND gates in an integrated circuit. Gates A and B are connected in a generally known multivibrator configuration having a frequency determined by capacitor 56 and potentiometer 57, with resistor 58 providing a high resistance for isolation purposes. Diode 59 enables normal use of the calculator without interference from the photometer circuitry that draws such a small current when operating that it need not be switched off for energy conservation. The photometer circuitry is connected across the plus key terminals of the calculator circuitry so that each pulse adds a previously entered "1" to the total.

Potentiometer 57 is useful for adjusting the frequency of the multivibrator formed by gates A and B to produce pulses at a rate that is compatible with the calculator circuitry. For most calculators, this rate falls within the range of 40 to 300 counts per second; and it is generally desirable to use a reasonably fast count rate for counting to at least three significant digits in a brief interval. Stability and precision can be obtained by synchronizing the count rate to a 60 Hz line frequency.

The components illustrated in FIG. 6 can usually be placed within empty space in a calculator case so that switch 55 is accessible and transducer 54 is located where it can conveniently be exposed to light. The user places transducer 54 in light radiation to be measured, and charge integrating capacitor 53 is normally grounded by push button switch 55 to inhibit the multivibrator until the user actuates the push button.

To obtain a light measurement, the calculator is turned on, its display is manually cleared, and a "1" is entered into the display via the keyboard. The user then holds switch 55 open, whereupon a charge accumulated on capacitor 53 discharges through transducer 54 at a rate determined by the resistance of transducer 54 and in turn by the intensity of the light energy incident on transducer 54. During the discharge time of capacitor 53, gate A is enabled, causing the multivibrator to produce essentially square waves applied to gate C. Gates C and D together act as an AND gate so that the multivibrator produces a series of pulses actuating the plus key terminal of the calculator circuitry, which responds by continually adding the previously entered digit "1" to display a summation increasing by one with each pulse. The summing stops when capacitor 53 discharges sufficiently to inhibit the multivibrator, and the time interval required for capacitor 53 to change from an initial state to a terminal state makes the total number of pulses delivered to the calculator circuitry proportional to the intensity of the light radiation impinging on transducer 54.

Figure 7:
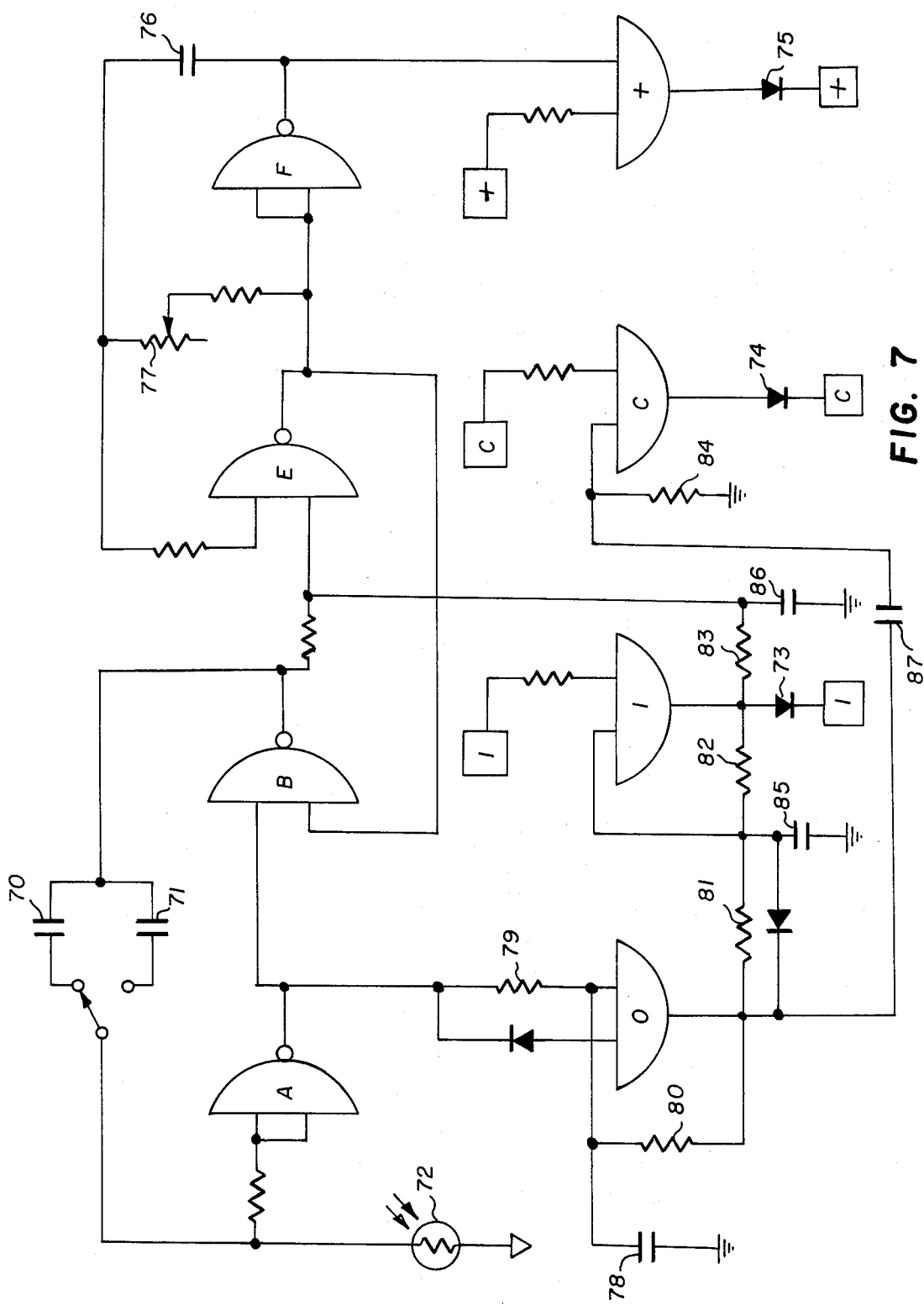
FIG. 7 is another preferred and more sophisticated embodiment of components usable for applying the invention to a pocket calculator.

FIG. 7 shows a more sophisticated photometer arranged for automatically repeating a light measurement and holding the last measurement in the display of a calculator. It also illustrates more extensive use of calculator circuitry capacity.

The RC circuit accommodates a wide range of light values by using either of the two integrating capacitors 70 and 71 in circuit with a light-dependent resistor 72 whose resistance changes with the intensity of incident light. Gates A, B, E, and F are CMOS NAND gates; and gates 0, 1, C, and plus are CMOS AND gates, the 1, C, and plus gates being connected respectively across the 1, C, and plus keys of a calculator. Diodes 73, 74, and 75 effectively disconnect the measuring circuit from the calculator keyboard, allowing the calculator to be used without interference from the photometer circuitry.

Gates E and F form a free running multivibrator having an adjustable frequency established by capacitor 76 and potentiometer 77 to supply pulses to the plus terminal of the calculator circuitry during the time interval for the change of state of the RC circuit. Gates A and B are in a one-shot configuration controlling the starting and stopping of the multivibrator in response to the initial stage and the terminal state of the integrating capacitor 70 or 71.

The interconnection of gates 0, 1, and C provide sequential gating with appropriate delays for clearing the display by actuating the clear key terminal when a measurement is completed, and entering a digit "1" into the display by actuating of the 1 terminal for a new measurement. AND gate 0 acts as a Schmitt trigger with a time delay established by capacitor 78. Resistors 79–84 and capacitors 85–87 establish appropriate time delays for proper sequencing.

The photometer of FIG. 7 measures light intensity over a period of a few seconds to a value of three significant digits and holds the final pulse count in the calculator display for about a second and then clears the display, reenters a "1", and repeats the measurement to display a new total every few seconds. Integration of the incident light averages out instantaneous variations or noise, and the speed of the photometer circuitry is made compatible with the calculator circuitry by adjustment of potentiometer 77.

Figure 8:
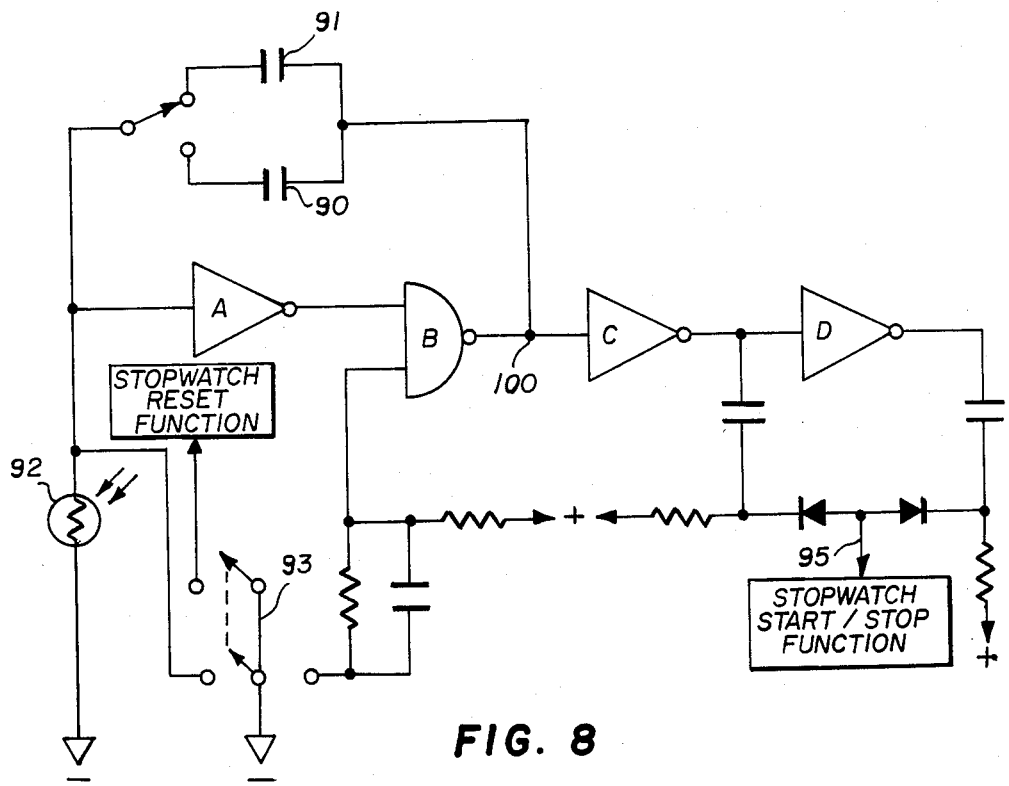
FIG. 8 is a preferred embodiment of components usable in applying the invention to a digital stopwatch.

The circuitry of FIG. 8 adds photometer capacity to a digital stopwatch. It includes high and low range integrating capacitors 90 and 91 in an RC circuit with a photoresistor 92. The added components connect to the stopwatch circuitry to provide start and stop pulses for starting and stopping the time base generator within the stopwatch. It includes a package of four gates A, B, C, and D, some of which are arranged as inverters so that gate C provides a start pulse and gate D provides a stop pulse to point 95.

Inverters C and D to the right of junction 100 produce brief negative pulses to stopwatch terminal 95 to start or stop the timing of the stopwatch whenever junction 100 changes state. Inverter A and NAND gate B to the left of junction 100 form a "one-shot" circuit containing photoresistor 92 whose value is an analog of light intensity. Switch 93 actuates this circuit and also resets the stopwatch display to zero so that manual switches on the stopwatch do not have to be separately actuated, except for a power-on switch, which also directs power to the interface circuit of FIG. 8.

When switch 93 is in the reset position, it not only resets the stopwatch display, but grounds the capacitor 90 or 91 that is in use and grounds junction 100 to a LO state. For a measurement, switch 93 is moved to the time position, releasing the ground from the reset function of the stopwatch and producing a momentary LO input to the lower NAND gate B input. This drives junction 100 HI, charges the in-circuit capacitor 90 or 91, and produces a start pulse at point 95. The charge drains off the in-circuit capacitor at a rate proportional to the resistance of transducer 92 and proportional to the energy being measured. When the voltage across transducer 92 falls below the transfer point for inverter A, it switches and causes junction 100 to go LO, producing a stop pulse at point 95. The stopwatch then displays a time value proportional to the energy impinging on transducer 92. As explained above, substitutions can be made in the RC circuit for measuring resistance or capacitance, and many types of transducers can be used for measuring different forms of energy.

Photometers according to the invention are especially convenient for darkroom use at a printing easel where negative density can be measured easily and processed and displayed in a convenient form. It can achieve high accuracy compared to other photographic parameters and can accomplish all that is presently being done with photometers costing far more money. Its usefulness in measuring resistance, capacitance, and other energy quantities is comparably versatile.

I claim:

1. A meter for measuring an analog value and displaying the result as a digital value, said meter comprising:
   a. means of the type used in electronic pocket calculators for displaying digits;
   b. electronic pocket calculator circuitry means electrically connected with said digital display means and having calculational capacity for operating said display means to display digits resulting from calculations;
   c. electronic pocket calculator keyboard means having keyboard terminals electrically connected with said circuitry means and arranged so that actuation of keys on said keyboard means produces electric pulses at said keyboard terminals to operate said circuitry means and display digits on said display means;
   d. at least one of said keyboard terminals being a summation terminal arranged relative to said circuitry means so that an electric pulse at said summation terminal advances a summation entered into said circuitry means and displayed by said display means;
   e. RC circuit means including an integrating capacitor and a resistive element electrically interconnected so that changing a charge on said capacitor from an initial state to a terminal state requires a time interval that varies as a function of said analog value;
   f. time base generator means electrically connected with said RC circuit and said summation terminal for producing and delivering actuation pulses to said summation terminal so that each pulse operates said circuitry means to advance said summation entered into said circuitry means and displayed by said display means;
   g. actuating switch means electrically connected with said RC circuit means and said time base generator means and arranged so that operation of said switch means starts said generator with said capacitor in said initial state; and
   h. gating means electrically connected with said RC circuit means and said time base generator means and arranged for stopping said generator means when said capacitor reaches said terminal state so that the total of said actuation pulses delivered to said summation terminal and the value displayed by said display means are functions of said analog value.

2. The meter of claim 1 wherein said actuating switch means includes means electrically connected with said keyboard terminals for automatically remeasuring and redisplaying said value.

3. The meter of claim 1 wherein said circuitry means includes means for making said value displayed a function of said pulses delivered.

4. The meter of claim 1 wherein said circuitry means includes means for memorizing a number and producing said value displayed as a function of said memorized number.

5. The meter of claim 1 wherein said analog value is an energy value and said resistive element in said RC circuit is a transducer that varies resistance in response to impinging energy so that said time interval varies proportionally to the resistance of said transducer and the energy impinging on said transducer.

6. The meter of claim 1 wherein said analog value is a capacitance value and said integrating capacitor is a capacitor to be measured.

7. The meter of claim 1 wherein said analog value is a resistance value and said resistive element in said RC circuit is a resistance to be measured.

8. The meter of claim 1 wherein said actuating switch means includes means electrically connected with said keyboard terminals for automatically remeasuring and redisplaying said value and wherein said circuitry means includes means for making said value displayed a function of said pulses delivered.

9. The meter of claim 8 wherein said circuitry means includes means for memorizing a number and producing said value displayed as a function of said memorized number.

10. The meter of claim 1 wherein said actuating switch means includes means electrically connected with said keyboard terminals for automatically remeasuring and redisplaying said value and wherein said analog value is an energy value and said resistive element in said RC circuit is a transducer that varies resistance in response to impinging energy so that said time interval varies proportionally to the resistance of said transducer and the energy impinging on said transducer.

11. The meter of claim 1 wherein said actuating switch means includes means electrically connected with said keyboard terminals for automatically remeasuring and redisplaying said value and wherein said analog value is a capacitance value and said integrating capacitor is a capacitor to be measured.

12. The meter of claim 1 wherein said actuating switch means includes means electrically connected with said keyboard terminals for automatically remeasuring and redisplaying said value and wherein said analog value is a resistance value and said resistive element in said RC circuit is a resistance to be measured.

13. The meter of claim 1 wherein said circuitry means includes means for making said value displayed a function of said pulses delivered and means for memorizing a number and producing said value displayed as a function of said memorized number.

14. The meter of claim 1 wherein said circuitry means includes means for making said value displayed a function of said pulses delivered and wherein said analog value is an energy value and said resistive element in said RC circuit is a transducer that varies resistance in response to impinging energy so that said time interval varies proportionally to the resistance of said transducer and the energy impinging on said transducer.

15. The meter of claim 1 wherein said circuitry means includes means for making said value displayed a function of said pulses delivered and wherein said analog value is a capacitance value and said integrating capacitor is a capacitor to be measured.

16. The meter of claim 1 wherein said circuitry means includes means for making said value displayed a function of said pulses delivered and wherein said analog value is a resistance value and said resistive element in said RC circuit is a resistance to be measured.

* * * * *